(12) United States Patent
Ogawa

(10) Patent No.: US 9,461,154 B2
(45) Date of Patent: Oct. 4, 2016

(54) TRENCH GATE MOS SEMICONDUCTOR DEVICE AND METHOD FOR MANUFACTURING THE SAME

(71) Applicant: FUJI ELECTRIC CO., LTD., Kawasaki-shi (JP)

(72) Inventor: Eri Ogawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/848,201

(22) Filed: Sep. 8, 2015

(65) Prior Publication Data
US 2015/0380538 A1 Dec. 31, 2015

Related U.S. Application Data

(63) Continuation of application No. PCT/JP2014/069630, filed on Jul. 24, 2014.

(30) Foreign Application Priority Data

Aug. 6, 2013 (JP) ................................. 2013-162948

(51) Int. Cl.

| H01L 29/66 | (2006.01) |
|---|---|
| H01L 29/739 | (2006.01) |
| H01L 29/423 | (2006.01) |
| H01L 29/10 | (2006.01) |
| H01L 21/02 | (2006.01) |
| H01L 21/28 | (2006.01) |
| H01L 29/08 | (2006.01) |
| H01L 29/417 | (2006.01) |
| H01L 29/49 | (2006.01) |

(52) U.S. Cl.
CPC ..... *H01L 29/7397* (2013.01); *H01L 21/02164* (2013.01); *H01L 21/02211* (2013.01);

(Continued)

(58) Field of Classification Search
USPC ......................................... 257/144, 330, 334
See application file for complete search history.

(56) References Cited

U.S. PATENT DOCUMENTS

| 5,329,142 A | 7/1994 | Kitagawa et al. |
|---|---|---|
| 6,815,769 B2 | 11/2004 | Pfirsch et al. |

(Continued)

FOREIGN PATENT DOCUMENTS

| JP | H05-243561 A | 9/1993 |
|---|---|---|
| JP | 2001-308327 A | 11/2001 |

(Continued)

OTHER PUBLICATIONS

Yamaguchi, M. et al., "IEGT design criterion for reducing EMI noise", Proceedings of The 16th International Symposium on Power Semiconductor Devices and ICs, (ISPSD '04), May 24-27, 2004, pp. 115-118.

*Primary Examiner* — Marc Armand
*Assistant Examiner* — Wilner Jean Baptiste
(74) *Attorney, Agent, or Firm* — Rabin & Berdo, P.C.

(57) ABSTRACT

A p-type base region, in which an n+ emitter region is formed, and a p-type floating region are provided in a surface layer of one main surface of an n-type semiconductor substrate and are separated from each other by a trench. An emitter electrode is provided so as to cover the p-type floating region, with an interlayer insulating film interposed there between, and to come into contact with the p-type base region and the n+ emitter region. In the trench, two divided polysilicon electrodes are provided in regions that face each other, with a cavity, which is surrounded by an insulating film, interposed there between, and are arranged along both side walls of the trench and are connected to different electrodes. With this structure, it is possible to ensure the insulation between the polysilicon electrodes in the trench, to reduce stress, and to suppress an increase in gate capacitance.

5 Claims, 11 Drawing Sheets

(52) U.S. Cl.
CPC ... *H01L21/02271* (2013.01); *H01L 21/28035* (2013.01); *H01L 29/0804* (2013.01); *H01L 29/1095* (2013.01); *H01L 29/41708* (2013.01); *H01L 29/4236* (2013.01); *H01L 29/4916* (2013.01); *H01L 29/66348* (2013.01)

(56) References Cited

U.S. PATENT DOCUMENTS

| | | |
|---|---|---|
| 2001/0054738 A1 | 12/2001 | Momota et al. |
| 2003/0160270 A1 | 8/2003 | Pfirsch et al. |
| 2005/0191810 A1 | 9/2005 | Matsuda et al. |
| 2007/0023828 A1* | 2/2007 | Kawamura ......... H01L 29/4236 257/330 |
| 2007/0145416 A1 | 6/2007 | Ohta et al. |
| 2009/0294843 A1 | 12/2009 | Radic et al. |
| 2010/0181640 A1 | 7/2010 | Shiromoto et al. |
| 2013/0043490 A1 | 2/2013 | Sorada |
| 2013/0248993 A1* | 9/2013 | Sedlmaier ............ H01L 21/765 257/334 |

FOREIGN PATENT DOCUMENTS

| | | |
|---|---|---|
| JP | 2005-243932 A | 9/2005 |
| JP | 2007-180310 A | 7/2007 |
| JP | 2010-171074 A | 8/2010 |
| JP | 5059989 B1 | 10/2012 |

* cited by examiner

TRENCH GATE MOS SEMICONDUCTOR DEVICE AND METHOD FOR MANUFACTURING THE SAME

CROSS-REFERENCE TO RELATED APPLICATIONS

This non-provisional application for a U.S. patent is a Continuation of International Application PCT/JP2014/069630 filed Jul. 24, 2014, which claims priority from JP PA 2013-162948 filed Aug. 6, 2013, the entire contents of both of which are hereby incorporated by reference.

BACKGROUND OF THE INVENTION

1. Field of the Invention

The present invention relates to a trench gate MOS semiconductor device that is used in, for example, a power conversion apparatus and a method for manufacturing the same, and more particularly, to an insulated gate bipolar transistor with a trench gate structure.

2. Background of the Related Art

A technique for reducing the power consumption of a power conversion apparatus has been developed. Particularly, there are great expectations for a technique for reducing the power consumption of a power device which plays a central role. Among the power devices, an insulated gate bipolar transistor (hereinafter, referred to as an IGBT) which can achieve a low on-voltage using a conductivity modulation effect and easily control the gate for voltage driving has been generally used.

A planar gate structure and a trench gate structure have been known as the gate structure of the IGBT. In the planar gate structure, for example, a planar conductive polysilicon electrode (hereinafter, simply referred to as a polysilicon electrode in some cases) which is formed over the surface of a wafer, with a gate oxide film interposed therebetween, is used as a gate electrode. In the trench gate structure, for example, a polysilicon electrode which is provided in a trench that is vertically formed in the depth direction from the surface of the wafer, with a gate oxide film interposed therebetween, is used as a gate electrode.

An IGBT with the trench gate structure (hereinafter, referred to as a trench gate IGBT) has a structure in which a channel that is a current path is formed in a p-type base region provided along the side wall surface of the trench when the IGBT is turned on. Therefore, in the trench gate IGBT, it is possible to increase channel density using, for example, a relatively simple method of reducing the gap between the trenches. The increase in channel density makes it possible to further reduce the on-voltage. Therefore, in recent years, the use of the IGBT with the trench gate structure has increased.

Various improvement methods have been proposed in order to further reduce the on-voltage of the trench gate IGBT. For example, JP 5-243561 A (Patent Document 1, see FIG. 101) discloses an injection enhanced gate bipolar transistor (IEGT). The IEGT has limitation characteristics close to the on-voltage of the diode.

The structure of the IEGT device is characterized in that the surface of an n$^+$ emitter region and the surface of a portion of a p-type base region are covered with an insulating film and there is a region (hereinafter, referred to as a p-type floating region) with which an emitter electrode does not come into electrical contact. When the IEGT is turned on, holes which are injected from the collector are less likely to be discharged to the emitter electrode and are likely to be stored below (on the drift layer side) the p-type floating region that is electrically insulated from the emitter electrode. As a result, the carrier concentration distribution of an n-type drift layer of the IEGT is close to the carrier concentration distribution of a diode and the on-voltage can be lower than that of a general trench gate IGBT.

On the other hand, the power device requires high-speed switching characteristics in addition to the low on-voltage and it is also important to improve the switching characteristics. However, in the trench gate IGBT and the IEGT, as the density of the trench structure increases in order to reduce the on-voltage, the gate capacitance increases and the switching characteristics deteriorate. That is, in the trench gate IGBT, it is necessary to charge and discharge the capacitance between the gate and the emitter and the capacitance between the gate and the collector when the trench gate IGBT is turned on and off, respectively. Therefore, when the gate capacitance increases, the charge and discharge time increases and the switching characteristics deteriorate. In addition, the deterioration of the switching characteristics means an increase in switching loss. The total loss of the power device is the sum of steady loss which is determined by the on-voltage and switching loss which occurs when the trench gate IGBT is turned on and off. Therefore, it is important to reduce the on-voltage and the switching loss, that is, the gate capacitance in order to reduce the total loss.

However, in the IEGT, the gate capacitance is substantially equal to the capacitance (mirror capacitance) between the gate and the collector, which causes an increase in turn-on loss. For the mirror capacitance, when the IGBT with the general trench gate structure is turned on and the gate voltage increases, first, the capacitance between the gate and the emitter is changed and then the capacitance (mirror capacitance) between the gate and the collector is changed. However, since the IEGT includes the p-type floating region, the gate capacitance is substantially equal to the capacitance (mirror capacitance) between the gate and the collector.

There are the following documents related to a reduction in the switching loss of the IGBT. FIG. 3 is a cross-sectional view illustrating a main portion of a cross-sectional structure taken along the line B1-B2 of FIG. 4. FIG. 4 is a plan view illustrating a main portion of a polysilicon gate electrode of a trench gate IGBT including a p-type floating region according to the related art. FIG. 3, for example, corresponding to FIG. 1 in JP 2001-308327 A (Patent Document 2), illustrates a main portion of the cross-sectional structure of an n-channel trench gate IGBT 100 including trenches which are arranged in a stripe-shaped plane pattern.

The IGBT 100 illustrated in FIG. 3 is characterized in that it has an IEGT structure. The IEGT structure includes an active region 112 that has a p-type base region 103 interposed between adjacent trenches 110 and an n$^+$ emitter region 104 selectively formed in the p-type base region 103 and a p-type floating region 111 that does not have the n$^+$ emitter region 104 formed in the p-type base region 103. The trench 110 has a depth that reaches an n$^-$ drift layer 102 from the surface of the n$^+$ emitter region 104 through the p-type base region 103. A gate electrode 106 (hatched) which is a polysilicon electrode is provided in the trench 110, with a gate oxide film 105 interposed therebetween. An interlayer insulating film 107 covers the upper part of the gate electrode 106 to hold the insulation of the gate electrode 106 from an emitter electrode 108 which is provided on the interlayer insulating film 107. The n$^-$ drift layer 102 is formed on the front surface of a p$^+$ substrate 101 by epitaxial growth and a collector electrode 109 is formed on the rear surface of the p+ substrate 101.

Therefore, when the IGBT is turned on, holes are less likely to be discharged to the emitter electrode 108 and are stored in the vicinity of the lower side of the p-type floating region 111. As a result, as described above, the carrier concentration distribution of the n− drift layer 102 is close to the carrier concentration distribution of the diode and the effect of reducing the on-voltage is obtained (for example, see Patent Document 2).

It has been reported that the turn-on characteristics need to be improved in M. Yamaguchi et al., "IEGT Design Criterion for Reducing EMI Noise", in Proc. ISPSD' 2004 pp. 115-118, 2004 (Non-patent Document 1, see the Abstract), which is common to the structure disclosed in Patent Document 2 and the structure disclosed in Patent Document 1.

U.S. Pat. No. 6,815,769 (Patent Document 3, see FIG. 1) discloses a structure which further improves the turn-on characteristics of the IGBTs (IEGTs) disclosed in Patent Document 1 and Patent Document 2. FIG. 5 is a cross-sectional view illustrating a main portion of the trench gate IGBT according to the related art. FIG. 5 corresponds to FIG. 1 in Patent Document 3. That is, one polysilicon electrode is not provided in the trench 215 illustrated in FIG. 5, but the polysilicon electrode is divided into two polysilicon electrodes 222a and 222b in a central portion of the trench 215 along the side wall of the trench 215. Of the divided polysilicon electrodes 222a and 222b, only the divided polysilicon electrode 222a which is close to the n+ emitter region 219 and the p-type base region 217 (close to the active region 210) is used as an effective gate electrode and the divided polysilicon electrode 222b which is close to the p-type floating region 220 is not connected to the gate electrode, but is connected to the emitter electrode 224.

Patent Document 3 also discloses a method for dividing the polysilicon electrode. That is, first, a polysilicon electrode is formed with a thickness that does not fill up the trench 215. With the polysilicon electrode remaining on the surface of the substrate, the polysilicon electrode in the bottom of the trench is etched, using the oxide film as a mask, to form the divided polysilicon electrodes 222a and 222b on both side walls. In addition, for example, a silicon oxide film 223 is filled between the divided polysilicon electrodes 222a and 222b in the trench 215 to insulate the divided polysilicon electrodes 222a and 222b on both side walls. Then, a lead portion from the polysilicon electrode on the surface of the substrate is formed. Reference numeral 212 indicates a collector electrode, reference numeral 213 indicates a collector layer, reference numeral 214 indicates a drift layer, reference numeral 216 indicates a gate oxide film, and reference numeral 225 indicates an interlayer insulating film.

In addition, a structure has been proposed in which a gate electrode provided in a trench has a cavity that is surrounded by a gate insulating film provided in the bottom of the trench, an interlayer insulating film provided at the top of the trench, and an electrode film provided on both side walls, in order to form a semiconductor device with a high-reliability trench gate structure, for example, see JP 2005-243932 A (Patent Document 4, FIG. 1 and paragraph 0012).

As disclosed in the above-mentioned Patent Document 3, in the method for forming the divided polysilicon electrodes 222a and 222b in the trench 215, the silicon oxide film 223 for insulation is filled between the divided polysilicon electrodes 222a and 222b. However, cyclic compression and tensile stress are applied to the silicon oxide film 223 and the divided polysilicon electrodes 222a and 222b by a thermal history during a manufacturing process, from the difference between the thermal expansion coefficients of the divided polysilicon electrodes 222a and 222b and the silicon oxide film 223 interposed therebetween. As a result, there is a concern that the gate characteristics will deteriorate or cracks will occur in the silicon oxide film 223, the divided polysilicon electrodes 222a and 222b, or the silicon substrate, resulting in an increase in leakage current. In addition, when the IGBT is turned on, the gate capacitance is increased by the silicon oxide film 223 (insulating film) interposed between the divided polysilicon electrodes 222a and 222b and the switching characteristics deteriorate.

The above-mentioned Patent Document 4 discloses a structure in which a cavity is provided between the divided gate electrodes to suppress the occurrence of stress due to the thermal history and to reduce the gate capacitance in the trench gate MOSFET, in order to solve the problem of the cracks due to stress or the deterioration of the characteristics. As disclosed in the above-mentioned Patent Document 4, in the structure in which the polysilicon electrode is simply divided into two electrodes, no problem occurs in the insulation between the divided polysilicon electrodes. However, in a structure in which one of the divided polysilicon electrodes is connected to the gate electrode and the other divided polysilicon electrodes is connected to the emitter electrode, the sufficient insulation between the two polysilicon electrode is not achieved only by the cavity.

The invention has been made in order to solve the above-mentioned problems. An object of the invention is to provide a trench gate MOS semiconductor device that can ensure insulation between divided polysilicon electrodes connected to different electrodes in a trench, reduce stress, and suppress an increase in gate capacitance due to an insulating film and a method for manufacturing the same.

SUMMARY OF THE INVENTION

In order to achieve the object, according an aspect of the invention, there is provided a trench gate MOS semiconductor device including: a plurality of p-type floating regions that are provided in a surface layer of one main surface of an n-type semiconductor substrate which will be a drift layer; a plurality of trenches that reach the vicinity of a bottom of the p-type floating region from the surface of the n-type semiconductor substrate; an emitter electrode that covers the surface of p-type floating region, with an interlayer insulating film interposed therebetween; a p-type base region that is formed in a surface layer of a portion of the n-type semiconductor substrate which is interposed between the plurality of trenches arranged in a parallel pattern and is shallower than the trench; an n-type emitter region that is formed in a surface layer of the second-conductivity-type base region so as to come into contact with the trench; and a first conductive polysilicon electrode and a second conductive polysilicon electrode that are formed in the trench along both side surfaces of the trench so as to be divided and separated from each other, with a cavity, which is surrounded by an insulating film, interposed therebetween. The emitter electrode comes into contact with both the surface of the p-type base region and the surface of the n-type emitter region. The first conductive polysilicon electrode and the second conductive polysilicon electrode are connected to different electrodes. The entire cavity is interposed between the first conductive polysilicon electrode and the second conductive polysilicon electrode. The interlayer insulating film may be a borophosphosilicate glass (BPSG) film or a phosphosilicate glass (PSG) film. The insulating film may be a high-temperature oxide (HTO) film or a tetraethyl orthosilicate (TEOS) film. The first conductive polysilicon electrode may be connected to a gate electrode and the second conductive polysilicon electrode may be connected to the emitter electrode. The trench gate MOS semiconductor device according to the above-mentioned aspect of the invention may further include a collector electrode that is provided over the other main surface of the drift layer, with a p-type collector layer, which is provided in a surface layer of the other main surface, interposed therebetween. The trench gate MOS semiconductor device may be an IGBT.

In addition, in order to achieve the object of the invention, according to another aspect of the invention, there is provided a method for manufacturing a trench gate MOS semiconductor device including: a step of forming, in a trench, a first conductive polysilicon electrode provided along one side wall of the trench and a second conductive polysilicon electrode provided along the other side wall of the trench; and a step of forming a silicon oxide film between the first conductive polysilicon electrode and the second conductive polysilicon electrode using a high-temperature CVD method or a low-temperature CVD method with a reactive gas including a silane gas. In this case, the insulating film is formed such that the entire cavity is interposed between the first conductive polysilicon electrode and the second conductive polysilicon electrode.

According to the invention, it is possible to provide a trench gate MOS semiconductor device that can reduce stress while ensuring insulation between divided polysilicon electrodes, which are connected to different electrodes, in a trench and can suppress an increase in gate capacitance due to an insulating film and a method for manufacturing the same.

DETAILED DESCRIPTION OF THE INVENTION

Figure 1:
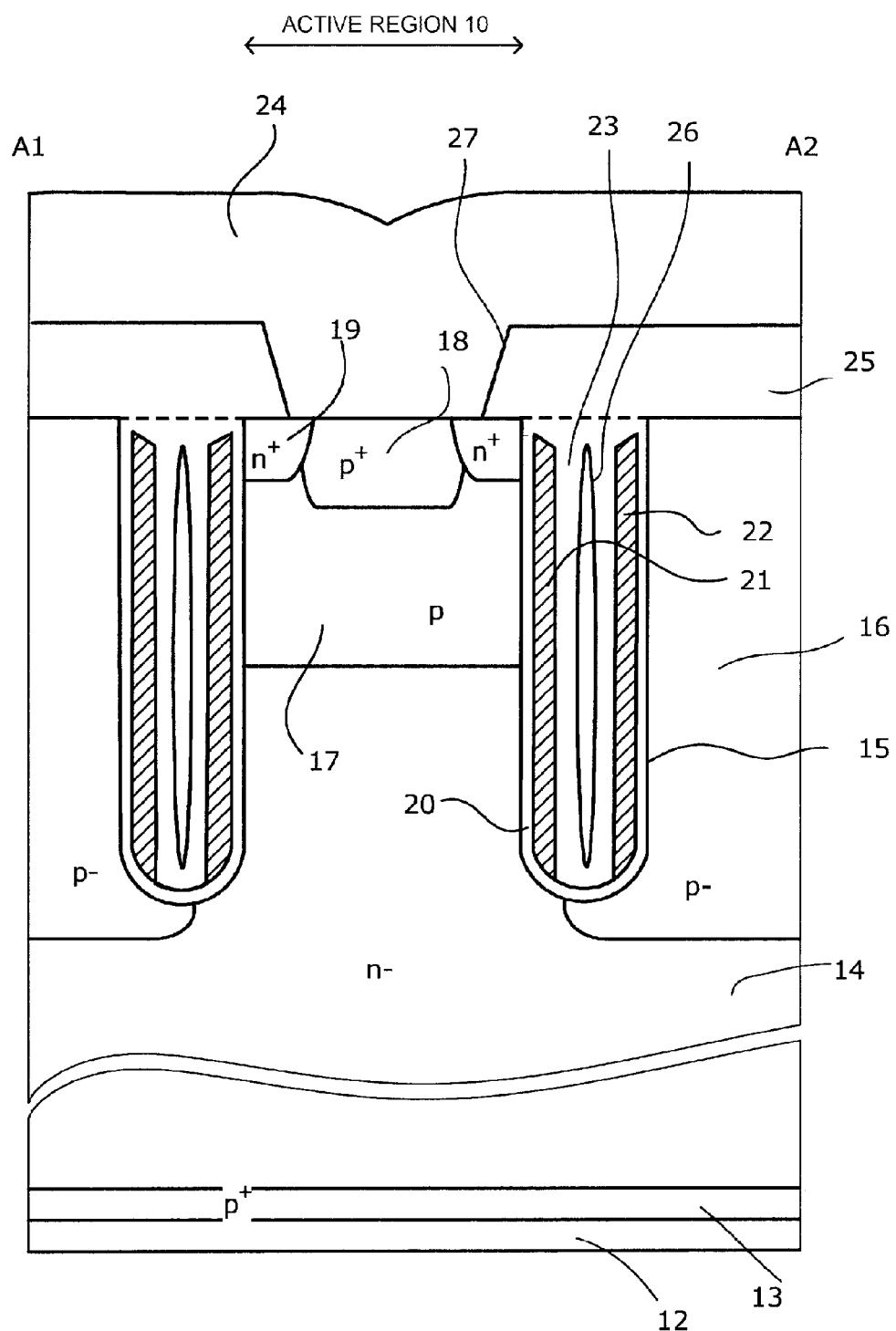
FIG. 1 is an enlarged cross-sectional view illustrating a main portion of a cross-sectional structure taken along the line A1-A2 of FIG. 2.

Hereinafter, embodiments of a trench gate MOS semiconductor device and a method for manufacturing the same according to the invention will be described in detail with reference to the drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated. In addition, in the accompanying drawings described in the embodiments, for ease of viewing or understanding, a scale and a dimensional ratio are different from the actual scale and dimensional ratio. The invention is not limited to the following embodiments as long as it does not depart from the scope and spirit thereof. In the specification, in the notation of the Miller indices, "−" means a bar added immediately before an index and "−" added before the index indicates a negative index.

Embodiment 1

Figure 2:
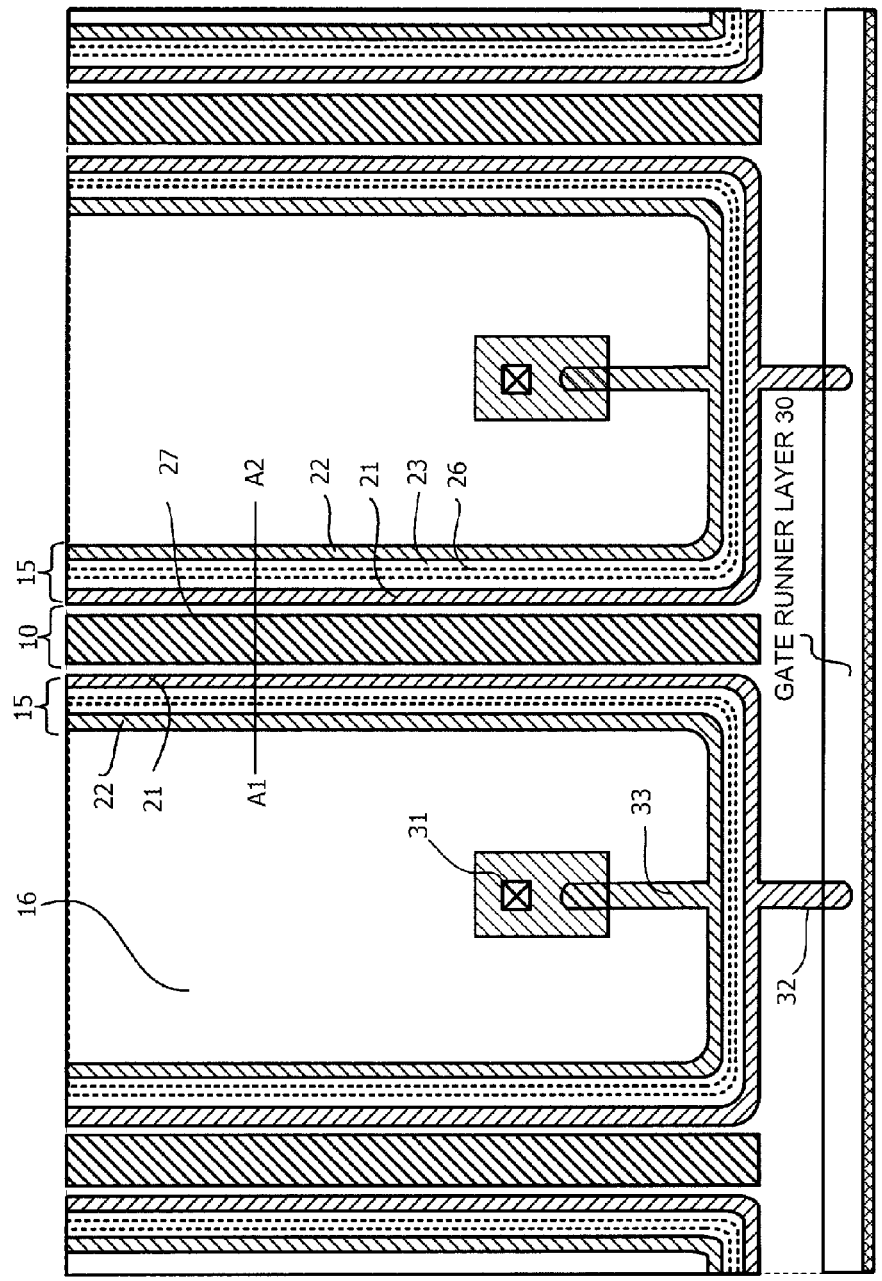
FIG. 2 is a plan view illustrating the planar layout of a main portion of a trench gate IGBT according to Embodiment 1 of the invention.
Figure 3:
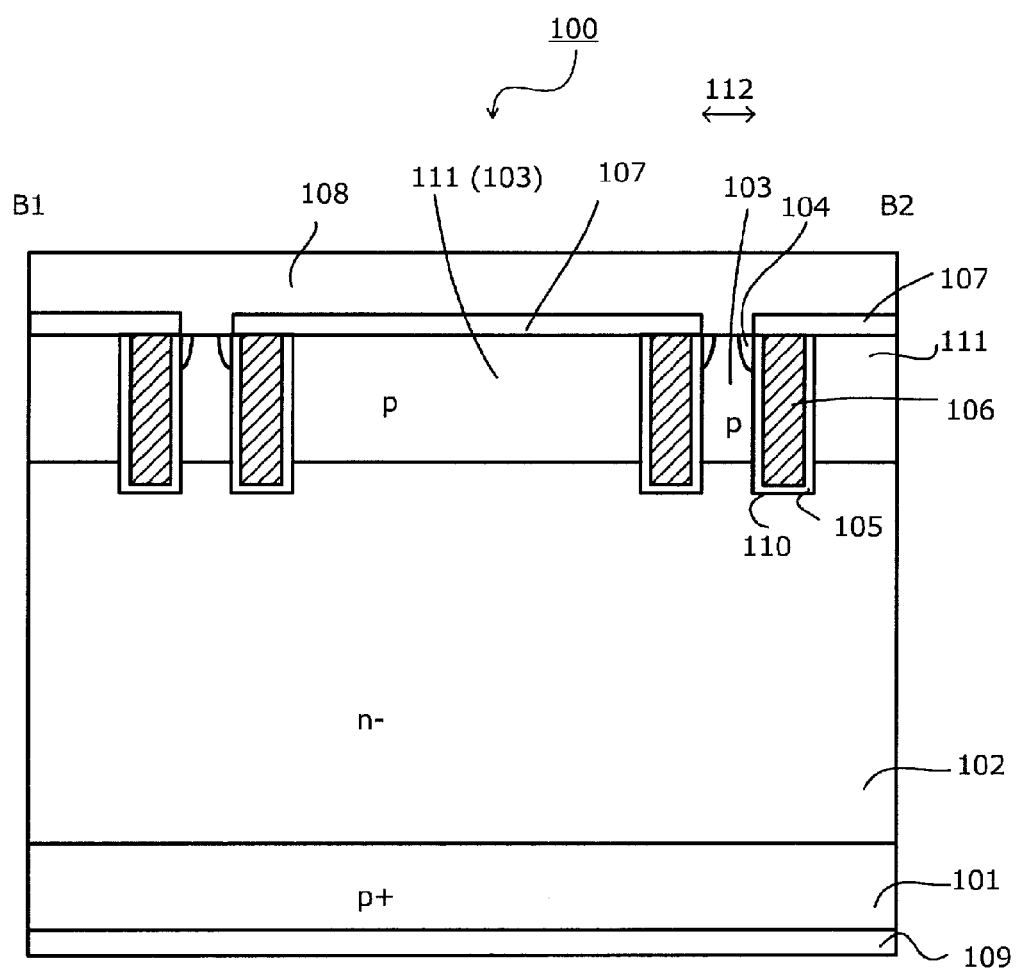
FIG. 3 is a cross-sectional view illustrating a main portion of a cross-sectional structure taken along the line B1-B2 of FIG. 4.
Figure 4:
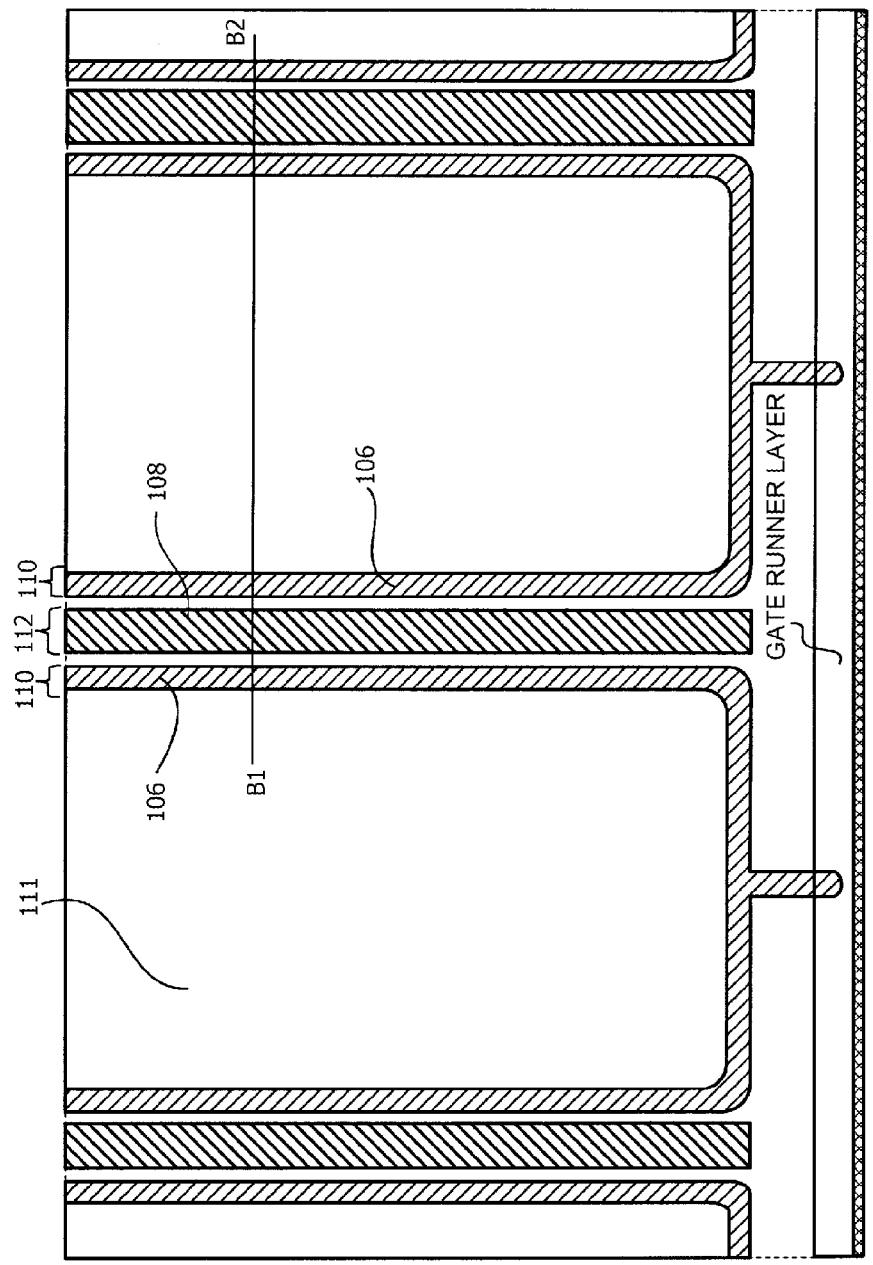
FIG. 4 is a plan view illustrating a main portion of a polysilicon gate electrode of a trench gate IGBT including a p-type floating region according to the related art.
Figure 5:
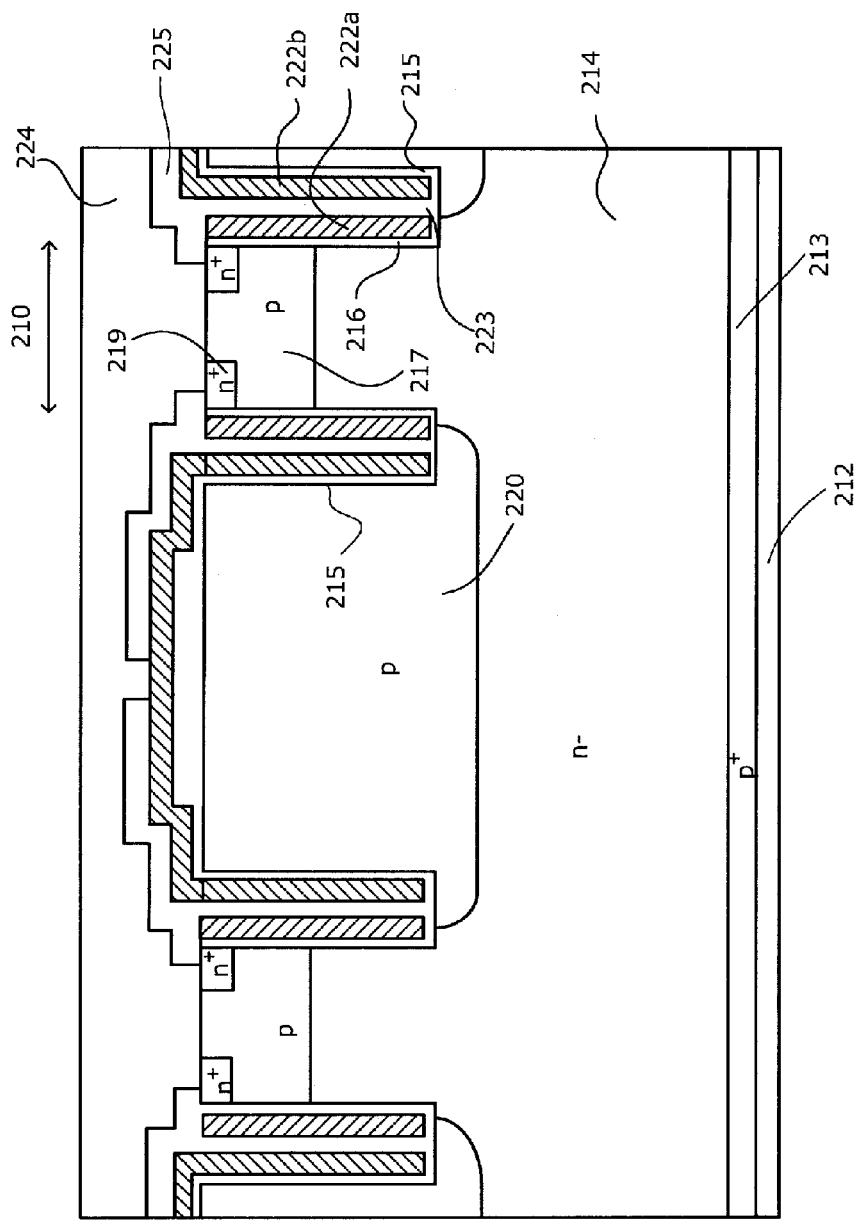
FIG. 5 is a cross-sectional view illustrating a main portion of the trench gate IGBT according to the related art.

The structure of a trench gate IGBT according to the invention will be described with reference to FIGS. 1 and 2. FIG. 2 is a plan view illustrating the planar layout of a main portion of a trench gate IGBT according to Embodiment 1 of the invention. FIG. 2 illustrates a divided polysilicon electrode 21 and a contact portion of the trench gate IGBT according to Embodiment 1 of the invention. FIG. 2 is a plan view illustrating a portion including an active region 10 that is interposed between trenches 15, which are parallel portions of a hatched plane pattern with a stripe shape, a p-type floating region 16 that is surrounded by the ring-shaped trench 15, and a gate runner layer 30 that is provided in the outer circumference of these regions, as viewed from the top. FIG. 1 is an enlarged cross-sectional view illustrating a main portion of the cross-sectional structure taken along the line A1-A2 of FIG. 2. The trench gate IGBT according to Embodiment 1 of the invention includes a trench gate structure having the divided polysilicon electrodes 21 and 22 provided in the trench 15 and the p-type floating region 16 that does not come into electrical contact with the emitter electrode 24.

Specifically, as illustrated in FIG. 1, a p-type base region 17 (and a p$^+$ contact region 18) and an n$^+$ emitter region 19 that is provided in a surface layer along the trench 15 are provided in the silicon substrate in the active region 10. An emitter electrode 24 comes into contact with the surfaces of the two regions through an emitter contact opening portion 27 which is formed in an interlayer insulating film 25.

In the ring-shaped trench 15, the polysilicon gate electrode 21 which is hatched in the drawings, is connected to a gate electrode, and is arranged close to the active region 10 and the polysilicon emitter electrode 22 which is connected to the emitter electrode 24 and is arranged close to the p-type floating region 16 are separated and divided. Each of the polysilicon gate electrodes 21 and 22 is provided along the side wall of the trench 15, with a gate insulating film 20 interposed therebetween. An HTO film 23 is formed between the polysilicon gate electrode 21 and the polysilicon emitter electrode 22 which are separated and divided in the trench 15. The HTO film 23 has a cavity 26 provided therein and the cavity 26 is closed in the vicinity of an opening portion of the trench 15. The trench gate IGBT according to the invention is characterized in that the cavity 26 is provided in the HTO film 23 formed in the trench 15. The HTO film 23 may be an oxide film formed by a low-temperature chemical vapor deposition (CVD) method. The length of the cavity 26 is less than the length of the two polysilicon electrodes 21 and 22 formed in the trench 15 in a direction perpendicular to the substrate and the entire cavity 26 is interposed between the polysilicon gate electrode 21 and the polysilicon emitter electrode 22. In addition, the maximum width of the cavity 26 is preferably equal to or more than a quarter of the distance between the boundaries between the gate insulating film 20 and each of the polysilicon gate electrode 21 and the polysilicon emitter electrode 22. In this case, it is possible to obtain the effect of suppressing the occurrence of cracks while ensuring the breakdown voltage of the two polysilicon electrodes 21 and 22 in the trench 15.

In the invention, as described above, the cavity 26 is provided in the HTO film 23 between the polysilicon gate electrode 21 and the polysilicon emitter electrode 22 provided in the trench 15. Therefore, it is possible to reduce gate capacitance, to suppress the deterioration of switching characteristics, and to reduce switching loss. In addition, even when the polysilicon gate electrode 21 and the polysilicon emitter electrode 22 which are connected to different electrodes and have the same potential are separated and divided in the trench 15, the HTO film 23 provided between the two polysilicon electrodes makes it possible to reliably ensure insulation. In addition, since the cavity 26 provided in the HTO film 23 absorbs stress, it is possible to obtain the effect of reducing or relaxing stress which occurs due to the difference between the thermal expansion coefficients of the oxide film and the polysilicon or silicon substrate.

In addition, the trench gate IGBT according to the invention includes the p-type floating region 16 which has a higher concentration than the p-type base region 17 and is deeper than the trench 15. Therefore, it is possible to reduce the on-voltage and to suppress the concentration of the electric field on the bottom of the trench 15. As a result, it is possible to obtain electrical characteristics without a reduction in breakdown voltage.

As illustrated in FIG. 2, the polysilicon gate electrode 21 which is arranged close to the active region 10 in the trench 15 may be connected to the gate runner layer 30 and the polysilicon emitter electrode 22 which is arranged close to the p-type floating region 16 in the trench 15 may be connected to an emitter electrode contact region 31 that is provided in a surface layer of the p-type floating region 16. In this case, for example, it is preferable to form lead trenches 32 and 33 which extend in the perpendicular direction from the plane pattern of the trench 15 to the gate runner layer 30 and the p-type floating region 16 in order to facilitate connection to the gate runner layer 30 and the emitter electrode contact region 31.

In addition, for example, a polyimide film, a nitride film, or an amorphous silicon layer is formed as a passivation film on the emitter electrode 24, which is not illustrated in the drawings.

As described above, according to Embodiment 1, it is possible to provide a trench gate MOS semiconductor device which has very low gate mirror capacitance and improved turn-on characteristics and reduces the on-voltage and switching loss, with only a slight increase in the number of process steps.

A method for manufacturing the trench gate MOS semiconductor device according to the invention will be described in detail with reference to FIGS. 6 to 11. FIGS. 6 to 11 are cross-sectional views illustrating a main portion of a method for manufacturing the trench gate IGBT according to Embodiment 1 of the invention. FIGS. 6 to 11 are the cross-sectional views of a surface layer of the substrate for illustrating the process flow of the structure in which the conductive polysilicon electrodes which are formed in the trench and are the characteristic portions of the trench gate IGBT according to the invention are separated and divided.

In the method for manufacturing the trench gate IGBT according to the invention, first, when the breakdown voltage is in the range of 600 V to 1200 V, an FZ-n semiconductor substrate (silicon substrate) 14 which has a resistivity of about 30 Ωcm to 60 Ωcm and will be a drift layer is prepared. Then, boron (B) ions are implanted with a dose of $5\times10^{14}$ cm$^{-2}$ to $3\times10^{15}$ cm$^{-2}$, using an insulating film formed on the (100) plane of the FZ-n semiconductor substrate 14, in order to selectively form the p-type floating region 16. Then, for example, the boron ions in the boron-ion-implanted layer are diffused by a high-temperature diffusion drive of about 1150° C. to obtain a p-type region with a depth of about 6 μm to 7 μm. Then, the entire surface of the substrate 14 is covered with the insulating film again. Then, the vertical trench 15 which has a stripe-shaped plane pattern and has a width of 1 μm to 3 μm and a depth of about 5 μm is formed from the surface of the substrate by, for example, anisotropic RIE etching so as to be laid across the outer edge of the p-type floating region 16 formed by ion implantation.

Figure 6:
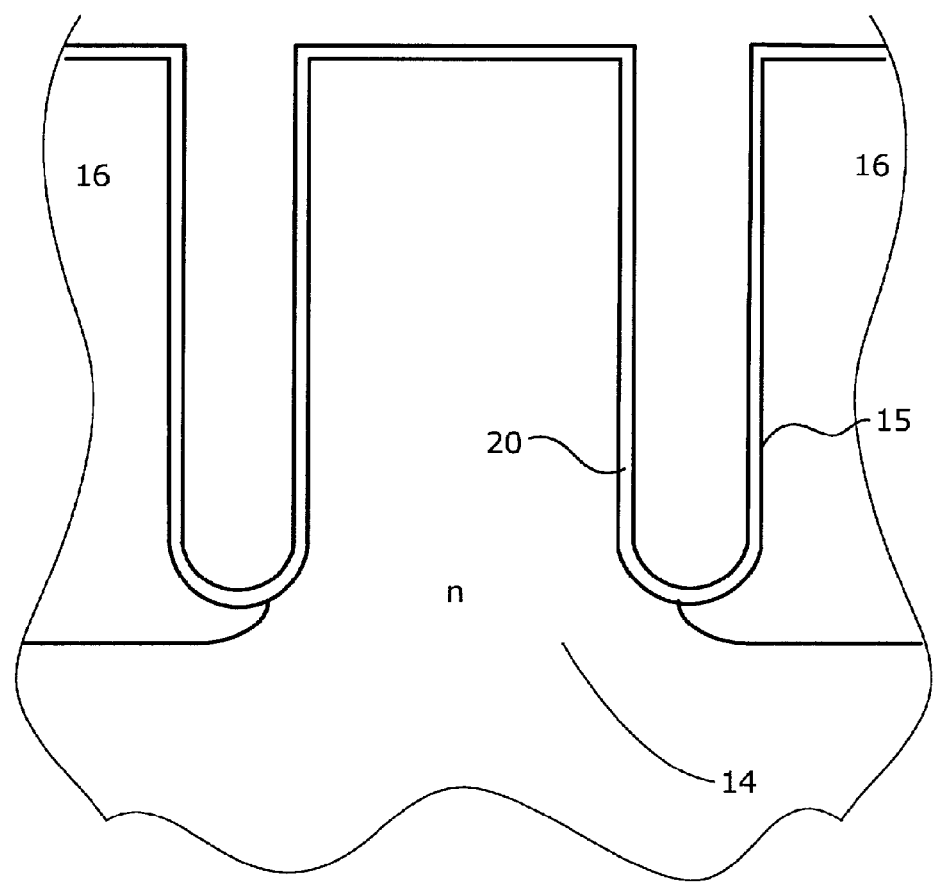
FIG. 6 is a cross-sectional view illustrating a main process of a method for manufacturing the trench gate IGBT according to Embodiment 1 of the invention (part 1)
Figure 7:
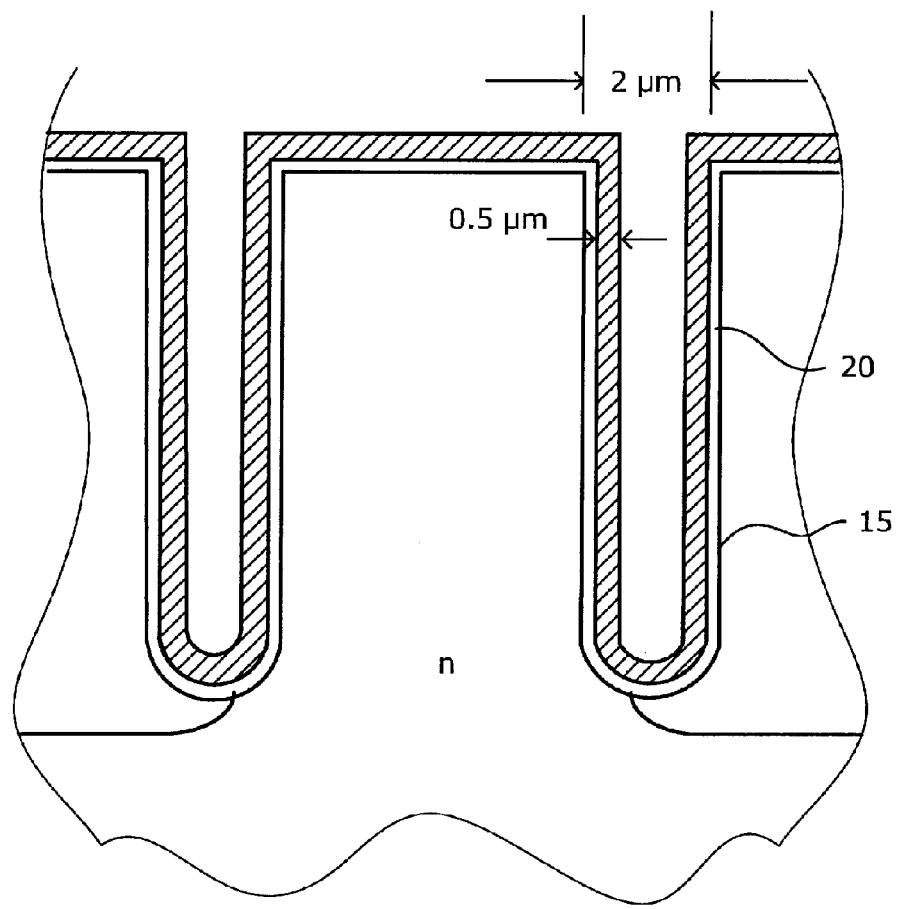
FIG. 7 is a cross-sectional view illustrating the main process of the method for manufacturing the trench gate IGBT according to Embodiment 1 of the invention (part 2)
Figure 8:
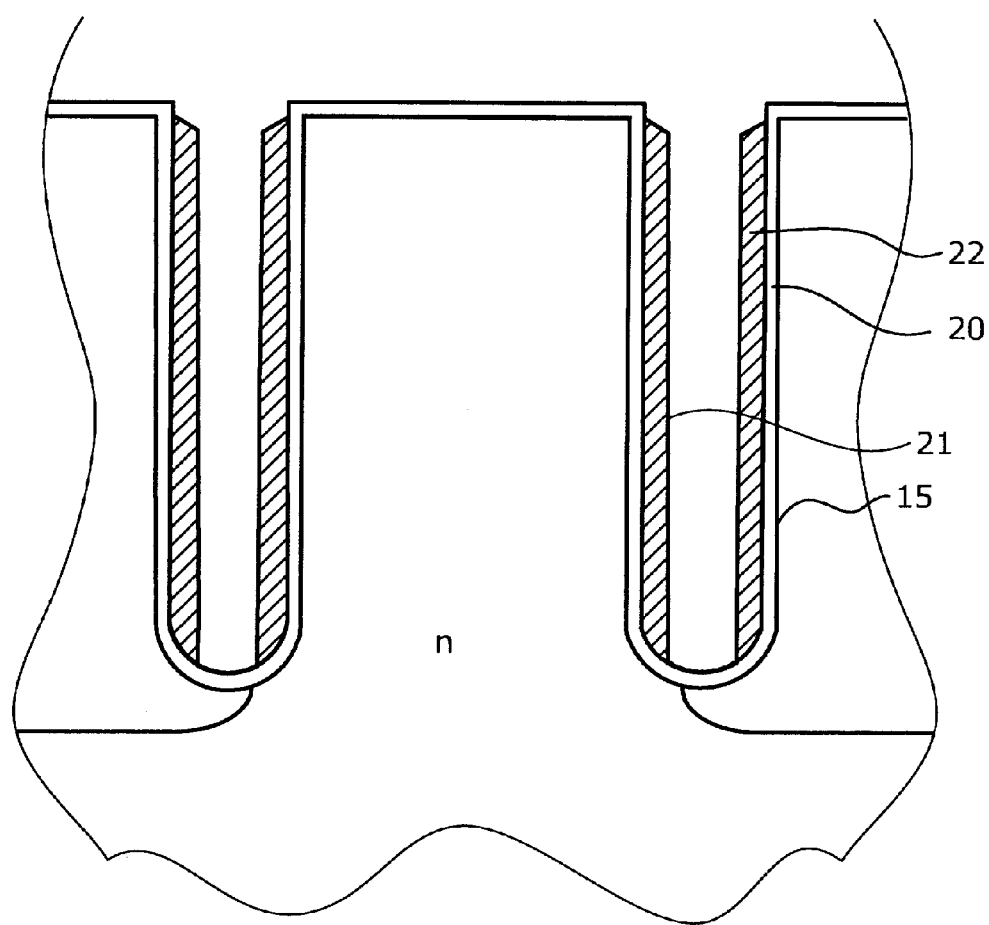
FIG. 8 is a cross-sectional view illustrating the main process of the method for manufacturing the trench gate IGBT according to Embodiment 1 of the invention (part 3)

Then, the gate insulating film 20 is formed on the inner wall of the trench 15, which is vertically formed from the surface of the silicon substrate 14, by a thermal oxidation method (FIG. 6). Then, in the trench 15, a polysilicon layer is grown to a thickness that does not fill up the trench 15. For example, it is preferable to grow the polysilicon layer with a thickness of about 0.5 μm with respect to the trench with a width of 2 μm. For example, the polysilicon layer is doped with impurities, such as boron, so as to have conductivity (FIG. 7). The conductive polysilicon layer is etched back by an anisotropic etching method such that portions of the conductive polysilicon layer which are disposed on the surface of the substrate 14 and at the top and bottom of the trench 15 are removed as illustrated in FIG. 8. In this way, the polysilicon gate electrode 21 and the polysilicon emitter electrode 22 can be formed along the side wall of the trench 15, with the gate insulating film 20 interposed therebetween.

Figure 9:
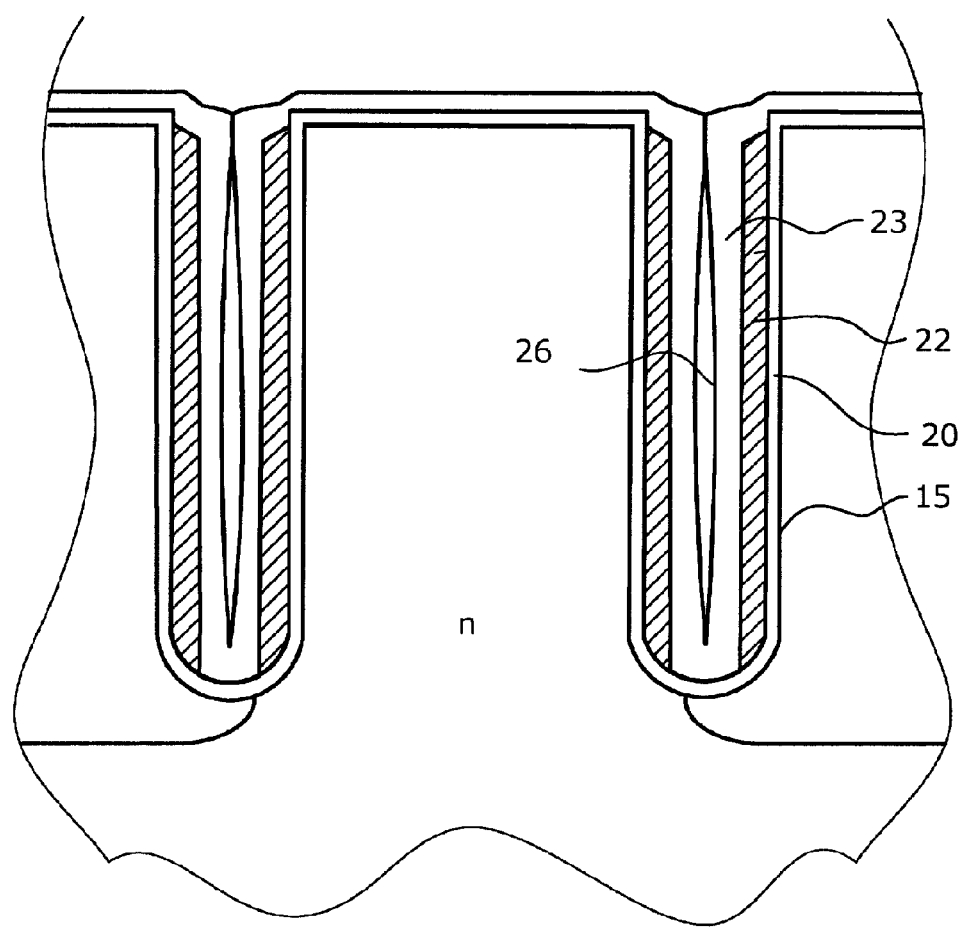
FIG. 9 is a cross-sectional view illustrating the main process of the method for manufacturing the trench gate IGBT according to Embodiment 1 of the invention (part 4)
Figure 10:
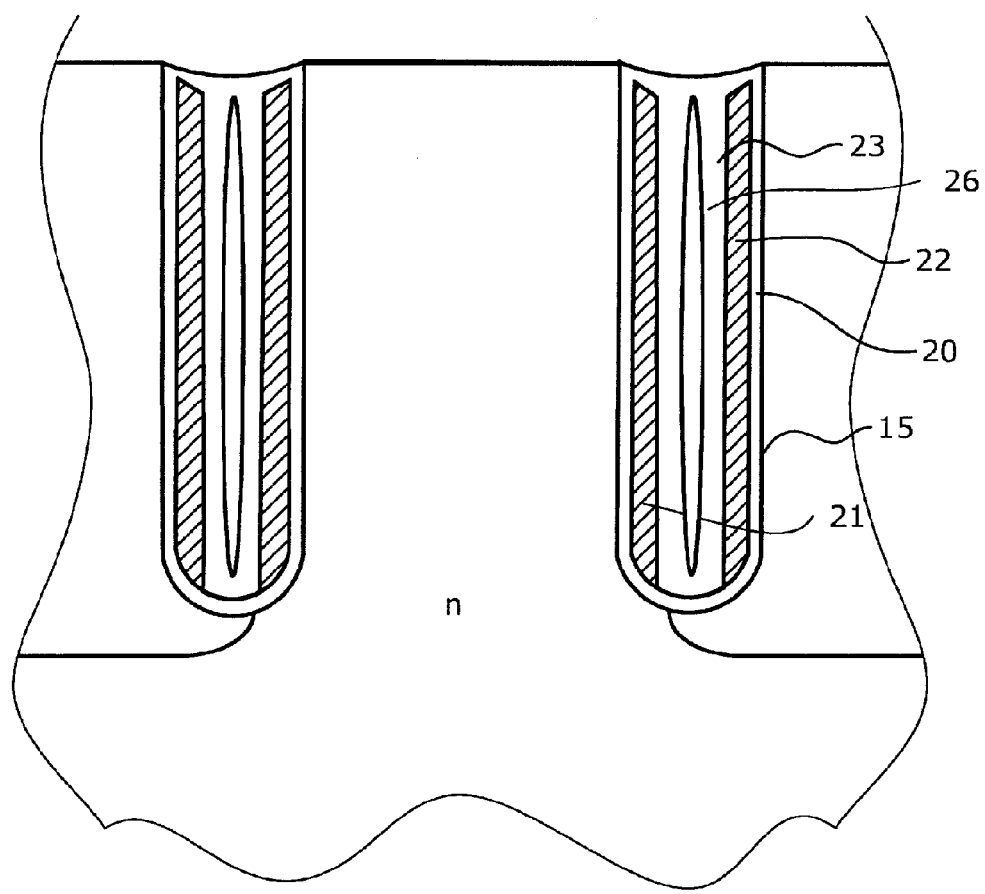
FIG. 10 is a cross-sectional view illustrating the main process of the method for manufacturing the trench gate IGBT according to Embodiment 1 of the invention (part 5)

Then, for example, the oxide film 23, such as an HTO film or a TEOS film, is formed on the inner surface of the trench 15 by a CVD method (FIG. 9). When the oxide film 23 and the gate insulating film 20 on the surface of the substrate are removed by etching-back, the oxide film 23 having the cavity 26 provided therein is filled between the divided polysilicon gate electrode 21 and the divided polysilicon emitter electrode 22 (FIG. 10). A process of forming the oxide film 23 will be described in detail below.

Then, the p-type base region 17 and the n$^+$ emitter region 19 are formed in a portion of the silicon substrate between adjacent trenches 15 by a general ion implantation method. Specifically, for example, the p-type base region 17 formed at a depth of 2 μm to 4 μm by the implantation of boron ions with a dose of $1\times10^{13}$ cm$^{-2}$ to $1\times10^{14}$ cm$^{-2}$ and by thermal diffusion at a temperature of 1150° C. For example, the depth of the p-type base region 17 is less than that of the trench 15. Then, the n⁺ emitter region 19 which comes into contact with the side wall of the trench 15 is selectively formed by ion implantation, using a photoresist formed on the surface of the p-type base region 17 as a mask. It is preferable that the n⁺ emitter region 19 be formed by the implantation of arsenic (As) ions.

Figure 11:
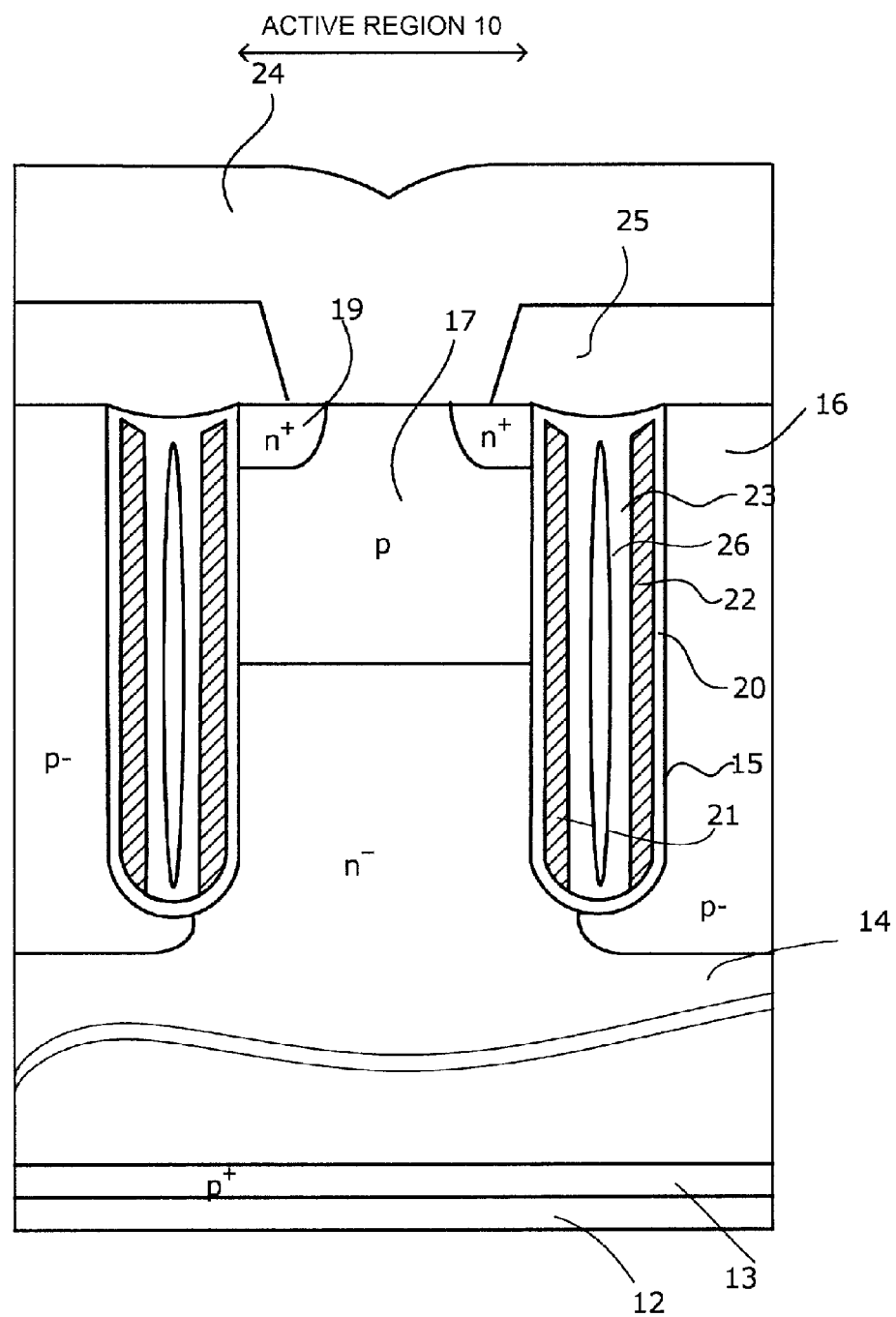
FIG. 11 is a cross-sectional view illustrating the main process of the method for manufacturing the trench gate IGBT according to Embodiment 1 of the invention (part 6).

Then, the surface of the p-type floating region 16 is covered with the interlayer insulating film 25 such that the p-type floating region 16 is insulated from the emitter electrode 24. Then, an opening portion is provided in the surfaces of the p-type base region 17 and the n⁺ emitter region 19, which will be the active region 10, and the emitter electrode 24 is formed by sputter deposition. The interlayer insulating film 25 may be, for example, a BPSG film or a PSG film. In addition, a passivation film, such as a polyimide film, is formed on the emitter electrode 24. After the process for the front surface of the semiconductor substrate 14 ends, the rear surface of the semiconductor substrate 14 is polished to a predetermined thickness by a chemical mechanical polishing (CMP) apparatus. Then, after a predetermined surface treatment is performed, boron ions are implanted to form a p⁺ collector layer 13 and a collector electrode 12 comes into ohmic contact with the p⁺ collector layer 13 (FIG. 11). Then, the semiconductor substrate is divided into individual IGBT chips by a dicing process. In this way, the trench gate IGBT is completed.

Next, a process of forming the oxide film 23 will be described in detail. The conductive polysilicon electrode formed in the trench 15 is separated and divided into the polysilicon gate electrode 21 and the polysilicon emitter electrode 22 at the bottom of the trench 15 by anisotropic etching. Then, when the HTO film 23 is formed between the divided polysilicon electrodes 21 and 22, the HTO film 23 is closed at the opening portion of the trench 15 such that the cavity 26 remains along the inner surface of each of the polysilicon electrodes 21 and 22. As such, for example, the HTO film 23 having the cavity 26 provided therein is formed between the two polysilicon electrodes by a high-temperature CVD method at a temperature of 700° C. to 800° C. using silane (SiH₄) or nitrous oxide (N₂O) as supply gas. It is preferable to use a low-pressure CVD method in which the internal gas pressure of a chamber is in the range of 30 Pa to 200 Pa. The above-mentioned formation conditions of the HTO film 23 enable the cavity 26 to be formed in the HTO film 23 between the polysilicon gate electrode 21 and the polysilicon emitter electrode 22. When the cavity 26 is formed in the HTO film 23, the reactivity of gas in the surface increases and gas molecules are less likely to sufficiently flow between the polysilicon gate electrode 21 and the polysilicon emitter electrode 22 in the trench 15. As a result, the HTO film 23 is thick in the vicinity of the opening portion of the trench 15 and the cavity is likely to be closed.

In the above-described embodiment, the HTO film 23 has been described. However, a low temperature oxide (LTO) film may be used instead of the HTO film 23. In this case, the LTO film is formed, for example, at a temperature of 400° C., using silane and oxygen (O₂) as the supply gas. The internal pressure of the chamber may be in the range of 30 Pa to 200 Pa or may be normal pressure. Similarly to the above, when the LTO film is formed under the above-mentioned conditions, the reactivity of gas in the surface increases and gas molecules are less likely to sufficiently flow between the polysilicon gate electrode 21 and the polysilicon emitter electrode 22 in the trench 15. As a result, the cavity 26 is likely to be closed.

Even when the semiconductor device is exposed to a high-temperature heat treatment environment in the subsequent process, the cavity 26 absorbs the distortion of stress which occurs in the polysilicon gate electrode 21 close to the active region 10 and the polysilicon emitter electrode 22 close to the p-type floating region 16, which prevents the occurrence of cracks in the polysilicon electrodes 21 and 22 or the silicon substrate 14. Therefore, an increase in leakage current is suppressed and reliability is improved. In addition, since the cavity 26 is provided between the polysilicon electrodes 21 and 22 in the trench 15, gate capacitance is reduced, as compared to the device according to the related art in which the opening is filled up with the insulating film without a space therebetween. That is, it is possible to provide a trench gate IGBT which has a small leakage current, low gate mirror capacitance, and improved turn-on characteristics, without significantly increasing the number of process steps.

Various modifications and changes of the invention can be made without departing from the scope and spirit of the invention. For example, the dimensions or impurity concentration of each portion may be set to various values according to required specifications. In the above-described embodiments, the first conductivity type is an n type and the second conductivity type is a p type. However, in the invention, the first conductivity type may be a p type and the second conductivity type may be an n type. In this case, the same effect as described above is obtained.

INDUSTRIAL APPLICABILITY

As described above, the trench gate MOS semiconductor device and the method for manufacturing the same according to the invention are useful for power semiconductor devices which are used in, for example, power conversion apparatuses or power supply apparatuses of various industrial machines.

Explanations of Letters or Numerals
  12 COLLECTOR ELECTRODE
  13 p⁺ COLLECTOR LAYER
  14 SEMICONDUCTOR SUBSTRATE (DRIFT LAYER)
  15 TRENCH
  16 P-TYPE FLOATING REGION
  17 P-TYPE BASE REGION
  19 n⁺ EMITTER REGION
  20 GATE INSULATING FILM
  21 POLYSILICON GATE ELECTRODE
  22 POLYSILICON EMITTER ELECTRODE
  24 EMITTER ELECTRODE
  25 INTERLAYER INSULATING FILM
  30 GATE RUNNER LAYER
  32 LEAD TRENCH
  33 LEAD TRENCH

What is claimed is:
1. A trench gate MOS semiconductor device, comprising:
  a first-conductivity-type semiconductor substrate;
  a second-conductivity-type floating region that is provided in a surface layer of one main surface of the first-conductivity-type semiconductor substrate and that will be a drift layer;
  a plurality of trenches that reach a predetermined depth from the one main surface of the first-conductivity-type semiconductor substrate and that are arranged in a parallel pattern;
  a second-conductivity-type base region that is formed in a surface layer of a portion of the first-conductivity-type semiconductor substrate, which is interposed between the plurality of trenches arranged in a parallel pattern, and that is separated from the second-conductivity-type floating region by one trench of the plurality of trenches;

a first-conductivity-type emitter region that is formed in a surface layer of the second-conductivity-type base region so as to come into contact with said one trench;

an emitter electrode that comes into contact with the second-conductivity-type base region and the first-conductivity-type emitter region, and that covers the second-conductivity-type floating region;

an interlayer insulating film interposed between the emitter electrode and the second-conductivity-type floating region; and a first conductive polysilicon electrode and a second conductive polysilicon electrode that are formed in said one trench along respective side surfaces thereof so as to be separated from each other by an insulating film that surrounds a cavity, the insulating film and cavity being interposed there between, wherein the entire cavity is interposed between the first conductive polysilicon electrode and the second conductive polysilicon electrode, and wherein the first conductive polysilicon electrode and the second conductive polysilicon electrode are connected to different electrodes.

2. The trench gate MOS semiconductor device according to claim 1, wherein the interlayer insulating film is a BPSG film or a PSG film, and the insulating film is an HTO film or a TEOS oxide film.

3. The trench gate MOS semiconductor device according to claim 1, wherein the first conductive polysilicon electrode is connected to a gate electrode and the second conductive polysilicon electrode is connected to the emitter electrode.

4. The trench gate MOS semiconductor device according to claim 1, further comprising a collector electrode that is provided over another main surface of the first-conductivity-type semiconductor substrate, with a p-type collector layer, which is provided in a surface layer of the another main surface, interposed there between.

5. The trench gate MOS semiconductor device according to claim 1, wherein the trench gate MOS semiconductor device is an IGBT.

* * * * *